United States Patent [19]

Kuwabara

[11] Patent Number: 5,150,154
[45] Date of Patent: Sep. 22, 1992

[54] APPARATUS FOR FORMING IMAGES DISCHARGE LAMP AND CURRENT, TONE AND TEMPERATURE CONTROL MEANS

[75] Inventor: Satoru Kuwabara, Chiryu, Japan

[73] Assignee: Brother Kogyo Kabushiki Kaisha, Nagoya, Japan

[21] Appl. No.: 568,225

[22] Filed: Aug. 16, 1990

[30] Foreign Application Priority Data

Aug. 22, 1989 [JP] Japan .................. 1-215306
Sep. 29, 1989 [JP] Japan .................. 1-256344
Oct. 23, 1989 [JP] Japan .................. 1-275677

[51] Int. Cl.$^5$ .......................................... G03G 21/00
[52] U.S. Cl. .................... 355/208; 314/117; 314/309; 355/30; 355/69; 355/71; 355/229; 362/294
[58] Field of Search .......... 355/229, 27, 30, 69, 355/71, 208; 430/138; 362/294; 315/117, 309

[56] References Cited

U.S. PATENT DOCUMENTS

| | | | |
|---|---|---|---|
| 3,359,454 | 12/1967 | Scheppe .................. | 315/117 |
| 4,101,807 | 7/1978 | Hill ........................ | 355/69 X |
| 4,283,658 | 8/1981 | Parker .................... | 315/117 |
| 4,533,854 | 8/1985 | Northrup ................ | 315/117 |
| 4,797,598 | 1/1989 | Oikawa et al. ......... | 315/117 X |
| 4,860,058 | 8/1989 | Kobayashi et al. .... | 355/27 |
| 4,887,122 | 12/1989 | Morikawa ............... | 355/30 |
| 4,894,683 | 1/1990 | McGuire et al. ........ | 355/71 X |

FOREIGN PATENT DOCUMENTS

0295491 12/1988 European Pat. Off. ............ 355/229
58-88739 5/1983 Japan .

Primary Examiner—A. T. Grimley
Assistant Examiner—J. E. Barlow, Jr.
Attorney, Agent, or Firm—Oliff & Berridge

[57] ABSTRACT

The invention provides apparatus for forming images at a high speed and with small power consumption, in which a discharge lamp for exposure remains 'on' and electric power supplied to the lamp is reduced to such an extent that the lamp is turned down during standby period for exposure. The invention also provides image forming apparatus including a temperature detector for detecting the temperature of an exposure lamp, plural filters, actuators for moving the filters in and out of the optical path, and a controller for regulating the actuators based on temperature data, thus forming stable images irrespective of the temperature of the lamp. The invention further provides image forming apparatus including a cooling fan for cooling an exposure lamp and lamp temperature controller for maintaining the temperature of the exposure lamp constant by activating the cooling fan based on temperature data detected by a lamp temperature detector, thus forming stable images of a desirable color or tone.

12 Claims, 8 Drawing Sheets

APPARATUS FOR FORMING IMAGES DISCHARGE LAMP AND CURRENT, TONE AND TEMPERATURE CONTROL MEANS

BACKGROUND OF THE INVENTION

The present invention relates to an apparatus for forming images and is applied to, for example, a full color photocopier that forms images on a photosensitive recording medium through the process of exposure and development.

In an apparatus for forming images like a conventional full color photocopier, images are formed by exposing a photosensitive medium to light transmitted through or reflected by an original. A light source generally used for exposure is a halogen lamp or a fluorescent lamp, which is turned on during exposure and is then turned off.

In the photocopier, a larger quantity of light shortens the exposure time, and photocopies may be made at a higher speed. But even the largest quantity of light emitted from a halogen lamp is not sufficient for high-speed photocopy.

When a photosensitive material with a lower sensitivity than a semi-conductive sensitized material is used in the photocopier, higher luminous intensity is required for sufficient exposure. For example, when a photosensitive recording medium coated with sensitive microcapsules is used in the copying machine, a more efficient light source than the halogen lamp is required.

To solve the problems described above, a discharge lamp such as a metal halide lamp or a high-pressure sodium lamp is used as a light source. The metal halide lamp provides approximately three times as much light intensity as the halogen lamp with an identical electric power, and thus allows a higher copying speed. The metal halide lamp also gives higher luminous intensity, thus allowing a photosensitive material with a lower sensitivity to be exposed sufficiently.

The conventional image forming apparatus with the metal halide lamp, however, has the following problems. It takes a long time to stabilize the metal halide lamp or the discharge lamp after lighting. Hence, for the practical purpose, the metal halide lamp must not be turned off but remain 'on' though it requires large electric power. The long time for lighting of the lamp also causes the temperature to rise on the surface of the lamp, makes the color temperature of emitted light unstable, and also makes the tone of light variable. Stable images of a desirable color or tone are thus not obtained.

SUMMARY OF THE INVENTION

One objective of the invention is thus to provide an apparatus for forming images at a high speed and with small power consumption, in which a discharge lamp used as a light source for exposure remains 'on' and electric power supplied to the lamp is reduced to such an extent that the lamp is turned down during standby period for exposure.

Another objective of the invention is to provide an image forming apparatus with a discharge lamp used for exposure which gives stable images irrespective of the temperature of the lamp.

A further objective of the invention is to provide an image forming apparatus with a discharge lamp for exposure which gives images of a desirable color or tone by maintaining the color temperature of light emitted from the lamp constant.

The above and other related objectives are realized by the following features of the invention.

One feature of the invention is an apparatus for forming images including a discharge lamp as a light source for irradiating an original with light emitted therefrom and processing means for forming images corresponding to light reflected by the original, in which electric power supplied to the discharge lamp is reduced to such an extent that the lamp is turned down during standby period for exposure.

In the image forming apparatus thus constructed, since the discharge lamp is not turned off but is just turned down during standby period for exposure, it is stabilized only after a short warm-up. The apparatus thus realizes high-speed photocopying with lower power consumption.

Another feature of the invention is apparatus for forming images including a discharge lamp used for exposure, plural filters for controlling the tone of light reflected by or transmitted through an original, which is exposed to light emitted from the discharge lamp, driving means for selectively moving the filters in and out of the optical path for reflected or transmitted light, means for detecting the temperature of the discharge lamp, memory means for storing tone correction data corresponding to the temperature measured by the temperature detection means and control means for regulating the driving means based on the tone correction data.

In the apparatus thus constructed, the temperature detection means measures the temperature of the discharge lamp and the control means reads out tone correction data corresponding to the temperature from the memory means. The control means then regulates the driving means based on the tone correction data to control the filters. The driving means selectively moves the filters in and out of the optical path so as to control the tone of light reflected by or transmitted through the original, which is exposed to light from the discharge lamp.

Stable images are thus obtained irrespective of the temperature of the discharge lamp.

A further feature of the invention is an image forming apparatus for exposing a photosensitive recording medium M2 to light emitted from an exposure lamp M1 composed of a high pressure discharge tube containing high pressure gas, and for developing images on a copy sheet M3 corresponding to latent images formed on the photosensitive recording medium M2 through exposure, includes cooling means M4 for cooling the exposure lamp M1, means M5 for detecting the temperature of the exposure lamp M1, and lamp temperature control means M6 for maintaining the temperature of the exposure lamp M1 constant by activating the cooling means M4 based on temperature data detected by the lamp temperature detection means M5.

In the image forming apparatus thus constructed, the photosensitive recording medium M2 is exposed to light emitted from the high pressure discharge tube used as the exposure lamp M1 and images are developed on the copy sheet M3 corresponding to latent images formed on the photosensitive recording medium M2 through exposure. The lamp temperature detection means M5 detects the temperature of the exposure lamp M1 and the lamp temperature control means M6 activates the cooling means M4 based on the temperature data to cool the exposure lamp M1, thus maintaining the temperature of the exposure lamp M1 constant.

The exposure lamp M1 composed of the high pressure discharge tube is not over heated and the color temperature of light emitted from the exposure lamp M1 is maintained constant. Stable images of a desirable color are thus obtained.

BRIEF DESCRIPTION OF THE DRAWINGS

The invention may be best understood by referring to the following detailed description of a preferred embodiment and the accompanying drawings, wherein like numerals denote like elements and in which.

DETAILED DESCRIPTION OF PREFERRED EMBODIMENTS

Preferred embodiments of apparatus for forming images according to the invention are now described referring to the drawings.

Since there may be many modifications without departing from the scope of the invention, the embodiments below are not intended to limit the invention to the embodiments, but are intended to illustrate the invention more clearly.

Figure 1:
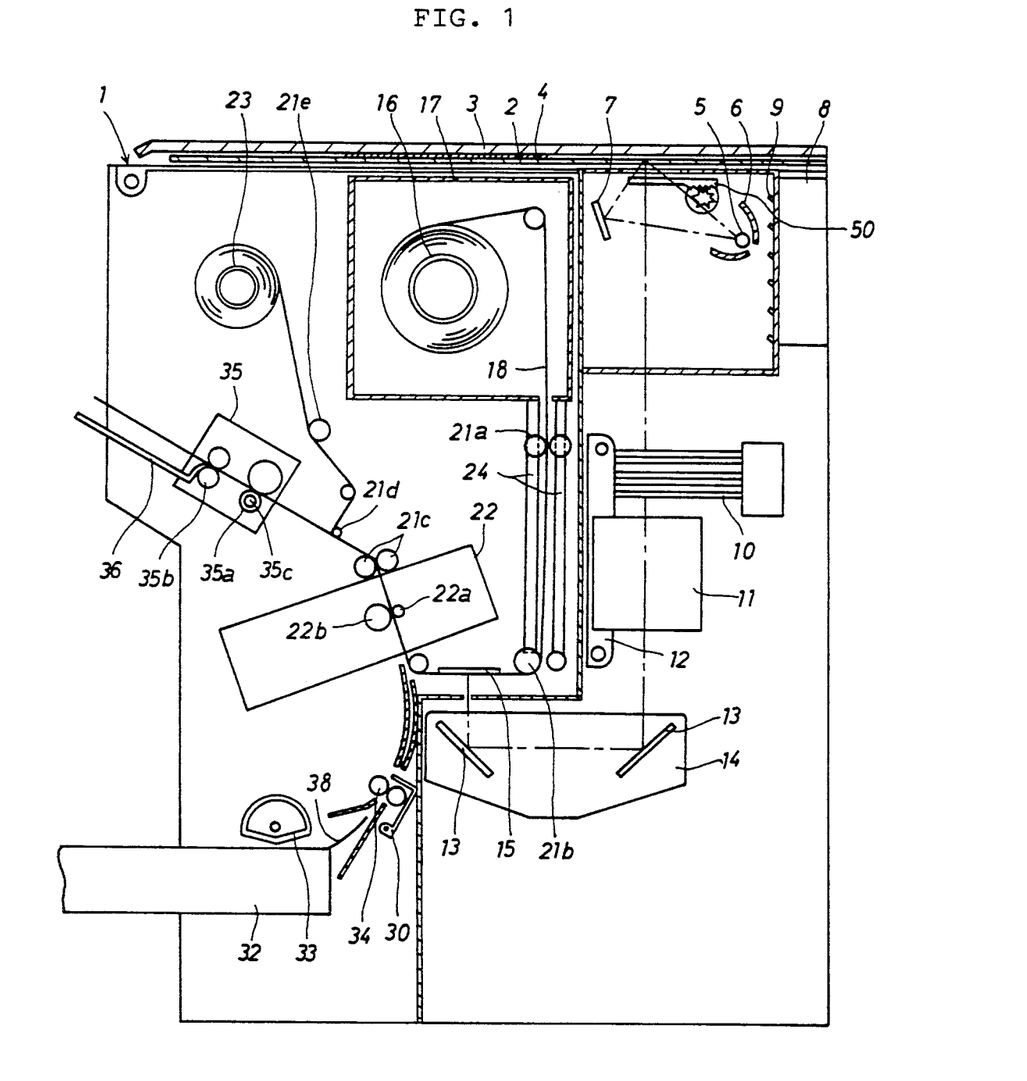
FIG. 1 is a schematic view illustrating a photosensitive, pressure sensitive copying machine of a first embodiment according to the invention.

FIG. 1 is a schematic view illustrating a first embodiment of the invention, that is, a photosensitive, pressure sensitive copying machine 1 for making full color photocopies. Photosensitive microcapsule-applied paper and a developer sheet, both of which are essential for the full color photocopies, will not described in detail here; they are disclosed in, for example, U.S. Pat. No. 4,399,209.

The photosensitive, pressure sensitive copying machine 1 (hereinafter referred to as the copying machine) has a laterally slidable glass base 2 and a cover 3; an original 4 lies face down on the glass base 2. On the upper right portion of the copying machine 1, a light source is fixed to send rays in line to the glass base 2. The light source includes a metal halide lamp 5 located at a right angle to the sliding direction of the glass base 2, an arc-shaped reflecting mirror 6 surrounding the metal halide lamp 5, and an optical path shutter 50.

The metal halide lamp 5 successively irradiates the glass base 2 from left end to right end since the glass base 2 moves laterally. Rays from the light source are sent to the glass base 2 through slits provided on the top of the copying machine 1, pass through the transparent glass base 2, and then are reflected by the original 4 faced down on the glass base 2. The upper face of the glass base 2 is shielded with the cover 3, thus preventing rays from being visible through the part of the glass base 2 not covered with the original 4.

A reflector 7 is mounted on the left of the light source so as to utilize rays emitted from the metal halide lamp 5 for irradiation of the original at a high efficiency. Namely, rays which are emitted in various directions other than towards the original 4 are reflected by the reflector 7 so as to be effectively utilized for irradiation of the original 4. The tone of light emitted from the metal halide lamp 5 varies depending on the surface temperature of the lamp 5.

A fan 8 and a louver 9 are provided for ventilation on the right of the metal halide lamp 5 and efficiently feed cooling air to the glass base 2. Rays emitted from the metal halide lamp 5 and reflected by the original 4 placed down on the glass base 2 pass through a filter 10 and enter a lens 11. The filter 10 changes the light permeability according to the sensitivity of microcapsule-applied paper 18 and controls the tone of images to be photocopied. The lens 11 is fixed on a lens attachment 12 and is capable of performing fine angular control to the optical path.

The rays are converged by the lens 11, are turned twice by two reflecting mirrors 13 as shown in FIG. 1 and are focused on the continuous microcapsule-applied paper 18 closely placed under an exposure stand 15. The two reflecting mirrors 13 are fixed on a mirror attachment 14. The optical path length and the focus of the rays are controlled by adjusting as required the position of the mirror attachment 14.

The continuous microcapsule-applied paper 18 is rolled up on a cartridge roller 16 and is accommodated in a detachable cartridge 17 provided below the glass base 2. An end of the microcapsule-applied paper 18 is led to a paper winding shaft 23 via plural rollers and a pressure developing unit 22.

The microcapsule-applied paper 18 is drawn out from the lower portion of the cartridge 17, passes below the exposure stand 15 via a feed roller 21a and a guide roller 21b and is fed to the pressure developing unit 22. The paper 18 then passes through a feed roller 21c, a separation roller 21d and a tension control roller 21e and is wound up onto the paper winding shaft 23. The microcapsule-applied paper 18 drawn out from the cartridge 17 is protected with a shielding cover 24 to remain unexposed.

The feeding speed of the microcapsule-applied paper 18 is controlled to be constant and also to coincide with the shifting speed of the glass base 2 by the feed roller 21c. When the microcapsule-applied paper 18 passes through the exposure stand 15, latent images corresponding to each line of the original 4 are formed successively on the microcapsule-applied paper 18.

A developer sheet cassette 32 for accommodating developer sheets 38 is provided below the pressure developing unit 22. The developer sheets 38 are drawn out one by one by an arc-shaped roller 33. The position of the upper end of the developer sheet 38 is adjusted by a developer sheet roller 34 and a register gate 30. The developer sheet 38 is then fed together with the microcapsule-applied paper 18 into a paper inlet of the pressure developing unit 22.

Namely, the developer sheet 38 and the microcapsule-applied paper 18 closely contact each other and are fed into the pressure developing unit 22. The pressure developing unit 22 includes a small roller 22a and a back up roller 22b. The developer sheet 38 and the microcapsule-applied paper 18 are pressed between the small roller 22a and the back up roller 22b while the microcapsule-applied surface of the microcapsule-applied paper 18, i.e., the surface on which latent images are formed, is in contact with the developer-applied surface of the developer sheet 38. The microcapsules unexposed are ruptured by the pressure, and the internal chromogenic composition is transferred to the developer sheet 38 to form chromatic images on the develop sheet 38.

The microcapsule-applied paper 18 and the developer sheet 38 drawn out from the pressure developing unit 22 are transported by the feed roller 21c and are separated by the separation roller 21d; sending the microcapsule-applied paper 18 upwards and the developer sheet 38 ahead. A thermal fixing unit 35 promotes the color development of the developer sheet 38 and eventually chromatic images are formed on the developer sheet 38. The developer sheet 38 with the face upward is then discharged to a paper tray 36. The thermal fixing unit 35 includes a hollow heat roller 35a accommodating a heater 35c therein and a developer sheet feed roller 35b. The microcapsule-applied paper 18 is wound up onto the paper winding shaft 23 via the tension control roller 21e.

Figure 2:
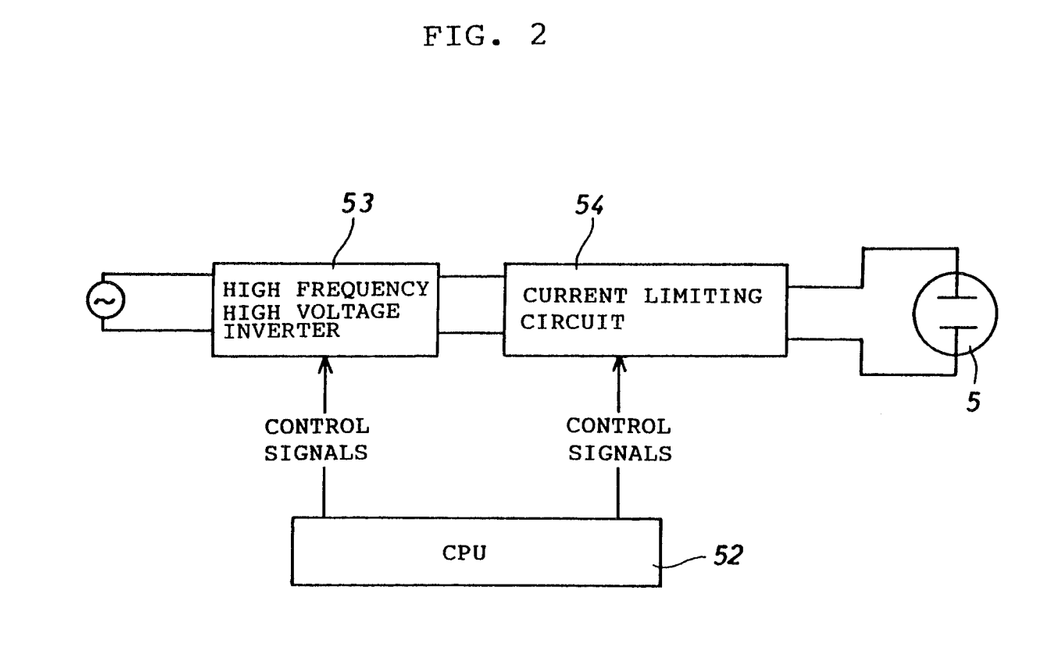
FIG. 2 is a block diagram illustrating primary features of the first embodiment.

FIG. 2 shows the electric construction of the copying machine 1 of the first embodiment for controlling the metal halide lamp 5. A central processing unit (hereinafter referred to as a CPU) 52 sends control signals to a high frequency high voltage inverter 53 so as to turn the metal halide lamp 5 'on' and 'off' and also to a current limiting circuit 54 so as to regulate electric power supplied to the metal halide lamp 5.

When electric power is supplied to the copying machine 1, the optical path shutter 50 moves to close the optical path and the CPU 52 sends control signals to turn the metal halide lamp 5 on. The metal halide lamp 5 becomes stable after several minutes, and the copying machine 1 stands ready for making photocopies. The CPU 52 then sends waiting signals to the current limiting circuit 54 to reduce electric power to such an extent that the metal halide lamp 5 is turned down.

An original 4 is placed down on the glass base 2 with the cover 3 open, and the cover 3 is then closed. When a start button (not shown) is pressed, the CPU 52 sends signals to the current limiting circuit 54 to turn up the metal halide lamp 5, and simultaneously the glass base 2 slides rightwards in FIG. 1 and stops at the position where the left end of the glass base 2 faces the light source. The control signals sent from the CPU 52 increase the discharge current of the metal halide lamp 5 and emission spectra of metal halides become stable only after a few seconds. The optical path shutter 50 then opens, and the original 4 is irradiated with rays from the metal halide lamp 5 while the glass base 2 moves back to the left. Rays emitted from the metal halide lamp 5 are reflected by the original 4, pass through the filter 10 and the lens 11, are reflected by the two reflecting mirrors 13, and are focused on the microcapsule-applied paper 18 located closely under the exposure stand 15. Since the microcapsule-applied paper 18 moves leftwards under the exposure stand 15 at the same speed as that of the glass base 2, latent images are formed on the microcapsule-applied paper 18 corresponding to the reflection from the original 4.

With the leftward movement of the glass base 2, the developer sheet 38 is drawn out from the developer sheet cassette 32 by the arc-shaped roller 33 and is superposed upon the microcapsule-applied paper 18 already exposed, and they are then fed together into the pressure developing unit 22. The latent images on the microcapsule-applied paper 18 are developed and transferred onto the developer sheet 38.

The developer sheet 38 is then thermally fixed by the thermal fixing unit 35 and is discharged from the copying machine 1. After passing through the pressure developing unit 22, the microcapsule-applied paper 18 is wound up onto the paper winding shaft 23. When the glass base 2 slides to the position at which the right end of the glass base 2 faces the light source, photocopying of the original 4 is accomplished and the optical path shutter 50 moves to close the optical path.

The CPU 52 sends waiting signals to the current limiting circuit 54 to reduce electric power as described above.

When the start button is pressed again, the CPU 52 controls the current limiting circuit 54 to increase electric current running into the metal halide lamp 5. The metal halide lamp 5 quickly becomes stable and the optical path shutter 50 opens for making a photocopy.

As described above, in the copying machine 1 of the first embodiment, photocopies are made at a high speed and metal halide lamp 5.

Figure 3:
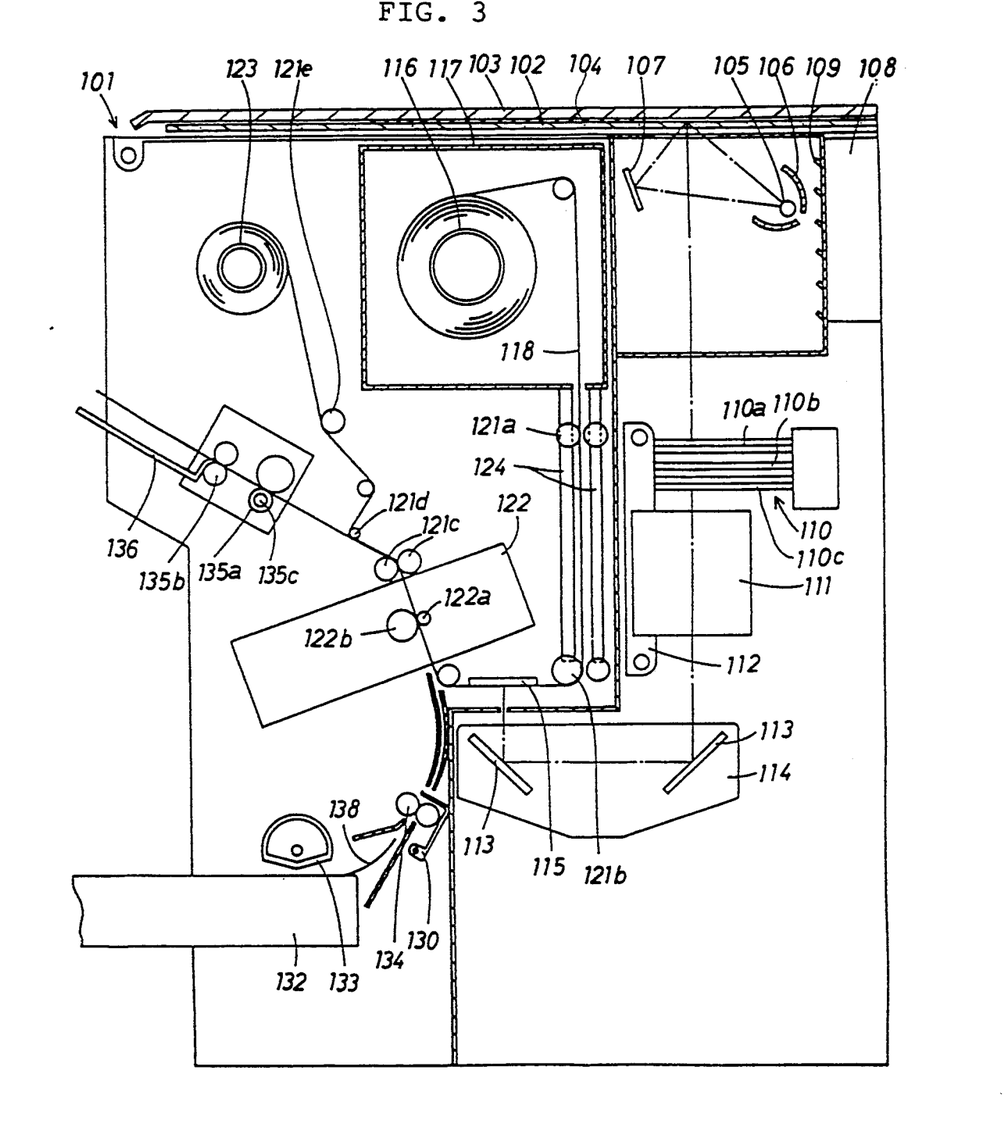
FIGS. 3 is a schematic view illustrating a photosensitive, pressure sensitive copying machine of the second embodiment.

Now a second embodiment according to the invention is described. FIG. 3 is a cross-sectional vie illustrating a full color copying machine 101 of the second embodiment. Since the copying machine 101 has a similar construction to that of the copying machine 1 of the first embodiment, only the construction different from the first embodiment is explained below.

A light source attached on the right upper portion of the copying machine 101 does not include an optical path shutter but consists of a cylindrical metal halide lamp 105 and an arc-shaped reflecting mirror 106 surrounding the metal halide lamp 105.

The copying machine 101 has plural filters 110, that is, three filters 110a, 110b and 110c of three primary colors. The filters 110a, 110b and 110c are selectively moved in and out of the optical path by a filter driving device 155 so as to control the tone of light transmitted. The filter driving device 155 may include two motors and two gears for selectively driving the three filters, for example, as disclosed in Japanese Utility Model Application No. Sho-63-45167 or may have another construction.

Figure 4:
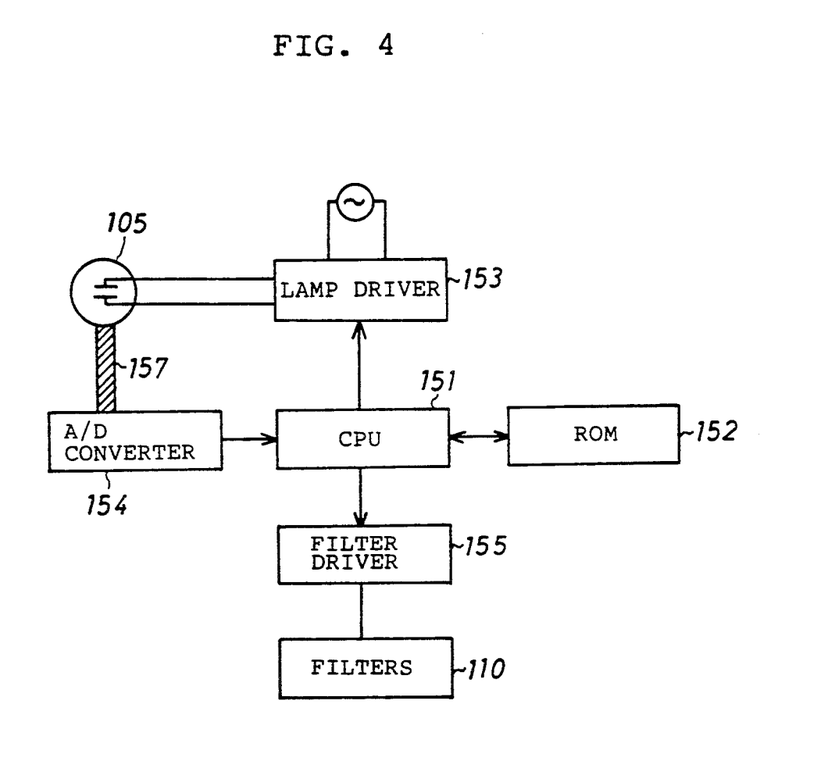
FIG. 4 is a block diagram showing primary features of the second embodiment.

The primary features of the second embodiment are now described based on the block diagram of FIG. 4. A read only memory 152 (hereinafter referred to as ROM), a lamp driver 153, an A/D converter 154 and the filter driving device 155 are respectively connected to a central processing unit 151 (hereinafter referred to as CPU). Programs for driving and regulating the entire copying machine 101 and tone correction data are stored in the ROM 152. Each tone correction value consists of a combination of two values; one for selecting the filters 110 and the other for determining driven amounts of the filters selected, and also corresponds to a temperature of the metal halide lamp 105. The metal halide lamp 105 is connected to the lamp driver 153. A thermocouple 157 is in contact with the base of the metal halide lamp 105 and is also connected to the A/D converter 154.

The operation of the copying machine 101 is similar to that of the first embodiment except for the primary features shown in FIG. 1, and the explanation is thus omitted here.

Figure 5:
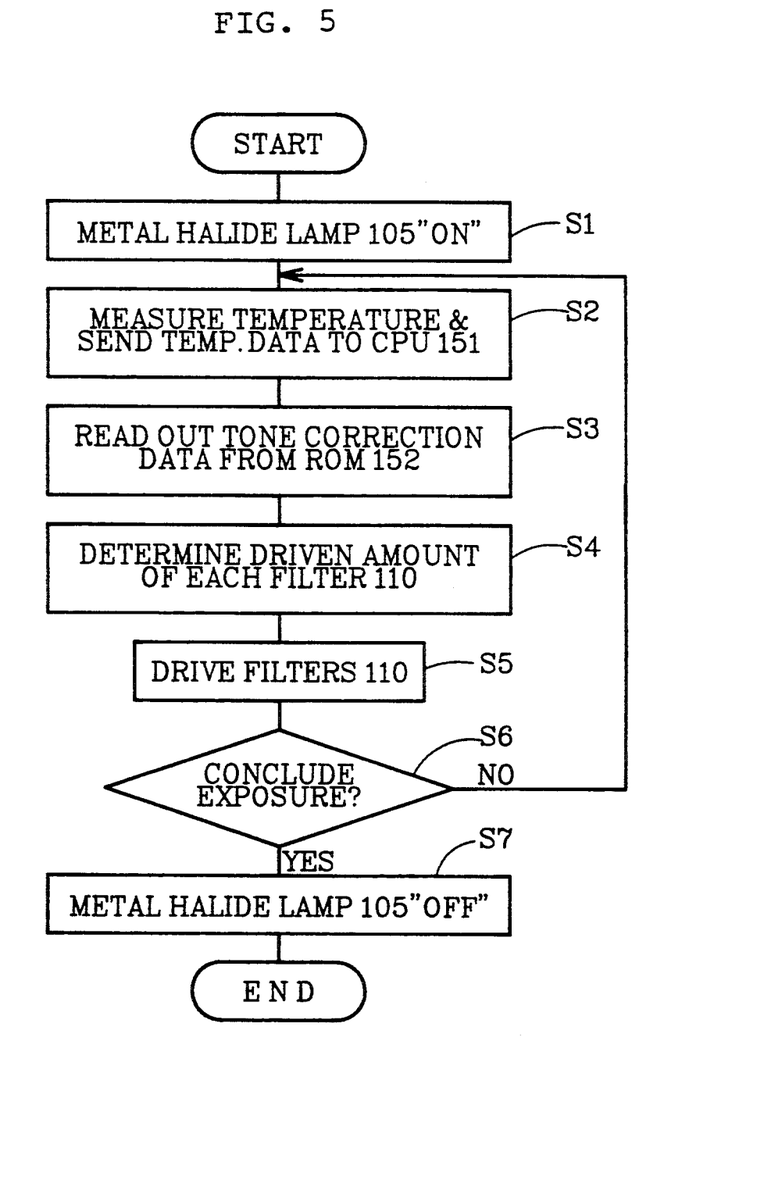
FIG. 5 is a flow chart showing the control routine of a metal halide lamp and filters in the second embodiment.

The control routine of the metal halide lamp 105 and the filters 110 during formation of latent images is described with the flow chart of FIG. 5.

The program starts at step S1 at which the lamp driver 153 turns on the metal halide lamp 105 based on signals sent from the CPU 151. At step S2, the thermocouple 157 detects the temperature on the base of the metal halide lamp 105 and the detected temperature data are converted into electrical signals and sent to the CPU 151. The program then proceeds to step S3 at which the CPU 151 reads out tone correction data corresponding to the temperature data input as electrical signals from the ROM 152. At step S4, the CPU 151 determines a driven amount of each filter 110a, 110b or 110c. Then at step S5, the filter driving device 155 moves the filters 110 by amounts corresponding to the signals sent from the CPU 151. The program then proceeds to step S6 where it is determined if exposure concludes. The above steps S2 through S6 are repeated during formation of latent images. When the temperature on the metal halide lamp 105 varies, the driven amounts of the filters 110 are changed and thus the tone or color of the reflected light is maintained stable. When it is determined that formation of latent images is accomplished and exposure concludes at step S6, the program proceeds to step S7 at which the lamp driver 153 turns off the metal halide lamp 105 based on signals sent from the CPU 151.

As described above, in the full color copying machine 101 of the second embodiment, the three different colored filters 110a, 110b and 110c are selectively driven based on tone correction data corresponding to the temperature of the metal halide lamp 105. The tone or color of light reflected by the original is thus maintained stable even when the temperature of the metal halide lamp 105 varies. Namely stable images are obtained irrespective of the temperature of the metal halide lamp 105.

In the second embodiment, the temperature of the metal halide lamp 105 is detected with the thermocouple 157 which is in contact with the base of the lamp 105, but it may be measured in other ways.

Figure 6:
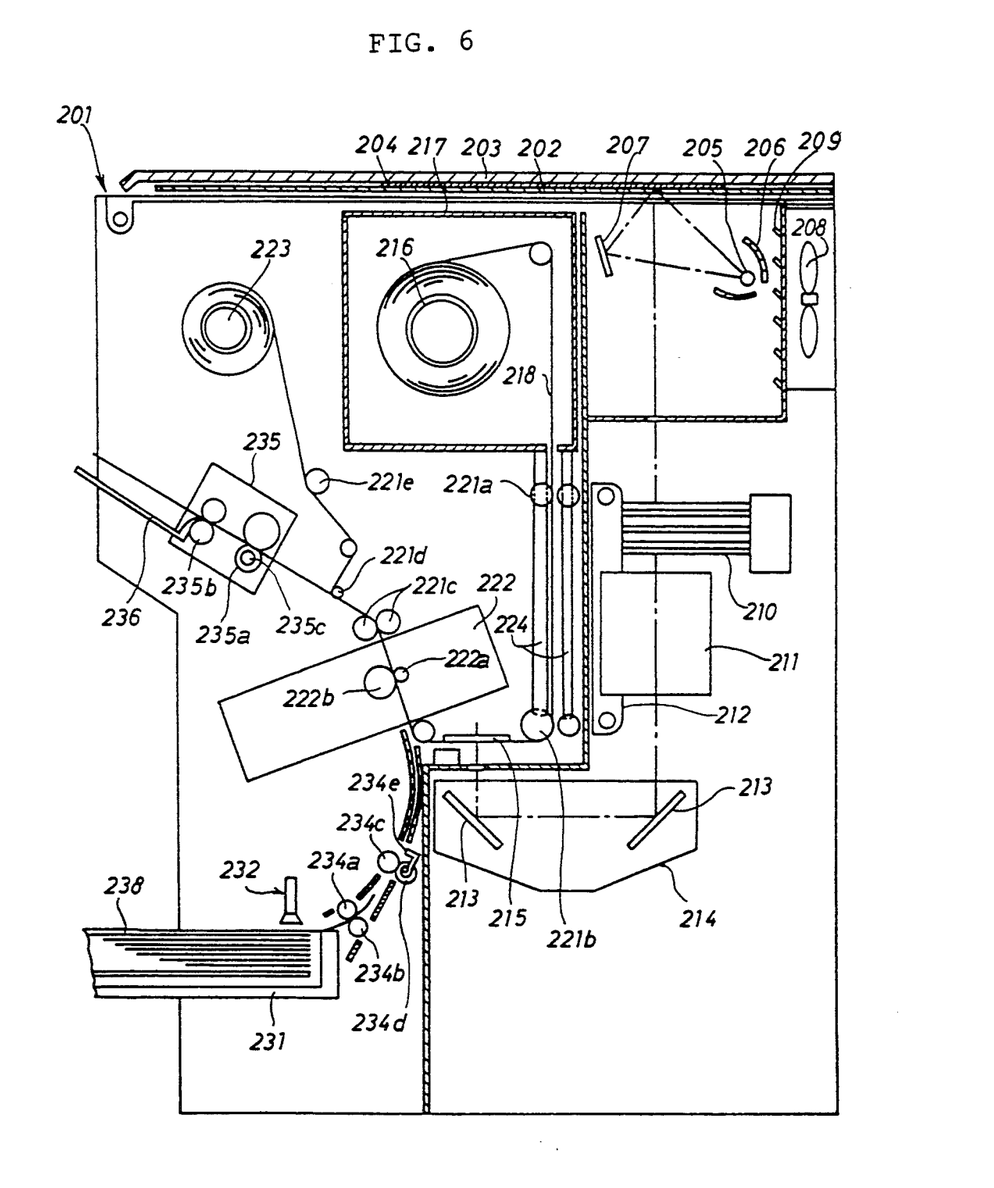
FIG. 6 is a schematic view illustrating a photosensitive, pressure sensitive copying machine of the third embodiment.

A third example according to the invention is now described. FIG. 6 is a cross-sectional view illustrating the third embodiment, that is, a photosensitive, pressure sensitive copying machine 201 for making full color photocopies. Since the copying machine 201 has a similar construction to that of the copying machine 1 of the first embodiment, only the construction different from the first embodiment is explained below.

A thermocouple 205a is mounted on the base of a metal halide lamp 205 for detecting the surface temperature of the metal halide lamp 205. A cooling fan 208 provided on the right of the metal halide lamp 205 is driven based on the temperature detected so as to cool the metal halide lamp 205. The process for controlling the surface temperature of the metal halide lamp 205 is described later.

A developer sheet cassette 231 for accommodating developer sheets 238 therein is detachably provided below a pressure developing unit 222. A feeding mechanism 232 also provided below the unit 222 sucks out the developer sheets 238 one by one and sends it through a feed roller 234a and a pinch roller 234b. The position of the upper end of the developer sheet 238 is adjusted by developer sheet rollers 234c and 234d and a register gate 234e. The developer sheet 238 is then fed together with microcapsule-applied paper 218 into a paper inlet of the pressure developing unit 222.

In the copying machine 201 of the third embodiment, an electronic control circuit described below controls exposure, development, and other processes so as to make full color photocopies of high quality.

Figure 7:
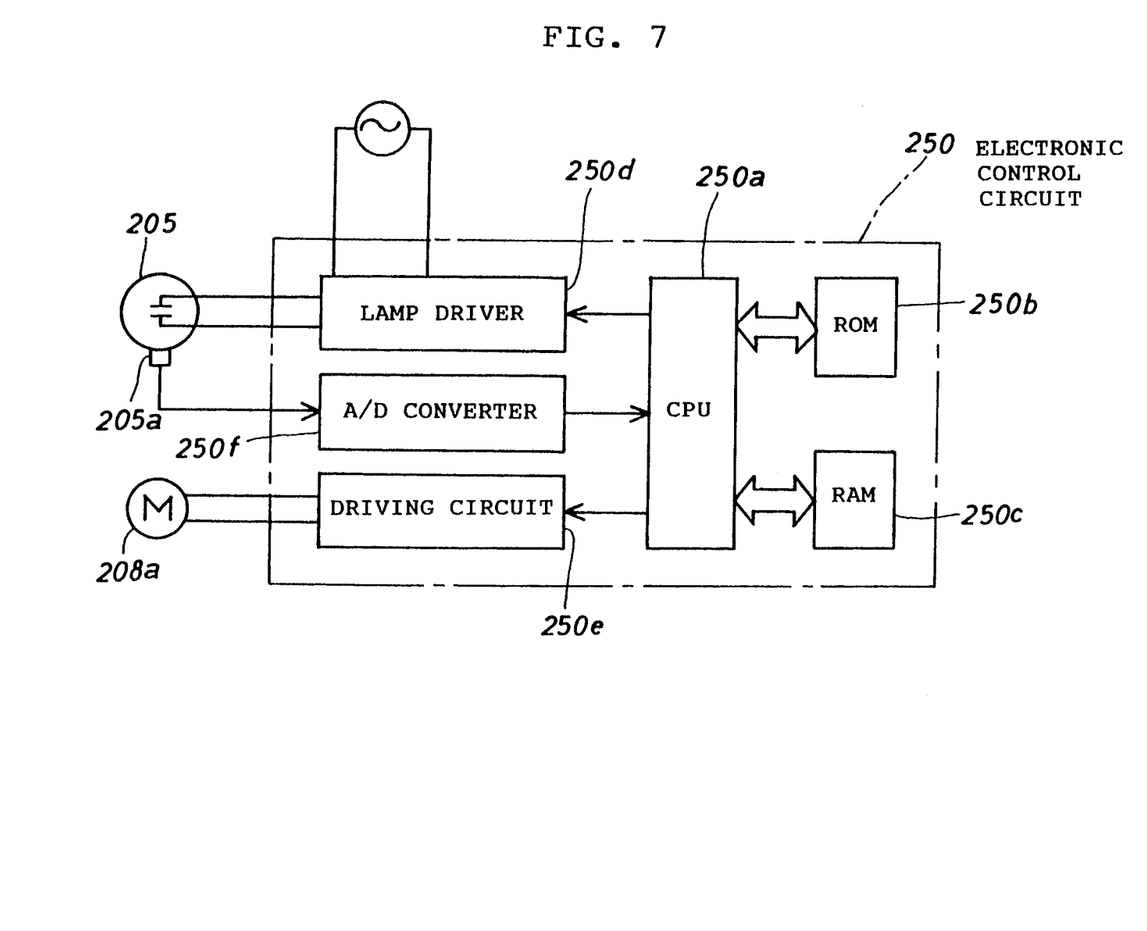
FIG. 7 is a block diagram showing a control system of the third embodiment including an electronic control circuit.

The construction of a control system including an electronic control circuit is explained based on FIG. 7.

As shown in FIG. 7, an electronic control circuit 250 includes a central processing unit (CPU) 250a for executing various controls, a read only memory (ROM) 250b for storing initial data as well as control programs essential for processing by the CPU 250a, and a random access memory (RAM) 250c for temporarily storing data used for processing by the CPU 250a. The electronic control circuit 250 further includes a lamp driver 250d for turning on the metal halide lamp 205 based on control signals from the CPU 250a, a driving circuit 250e for driving a motor 208a of the cooling fan 208 based on control signals from the CPU 250a and an A/D converter 250f for converting temperature data detected by the thermocouple 205a mounted on the metal halide lamp 205 into electrical signals.

Figure 8:
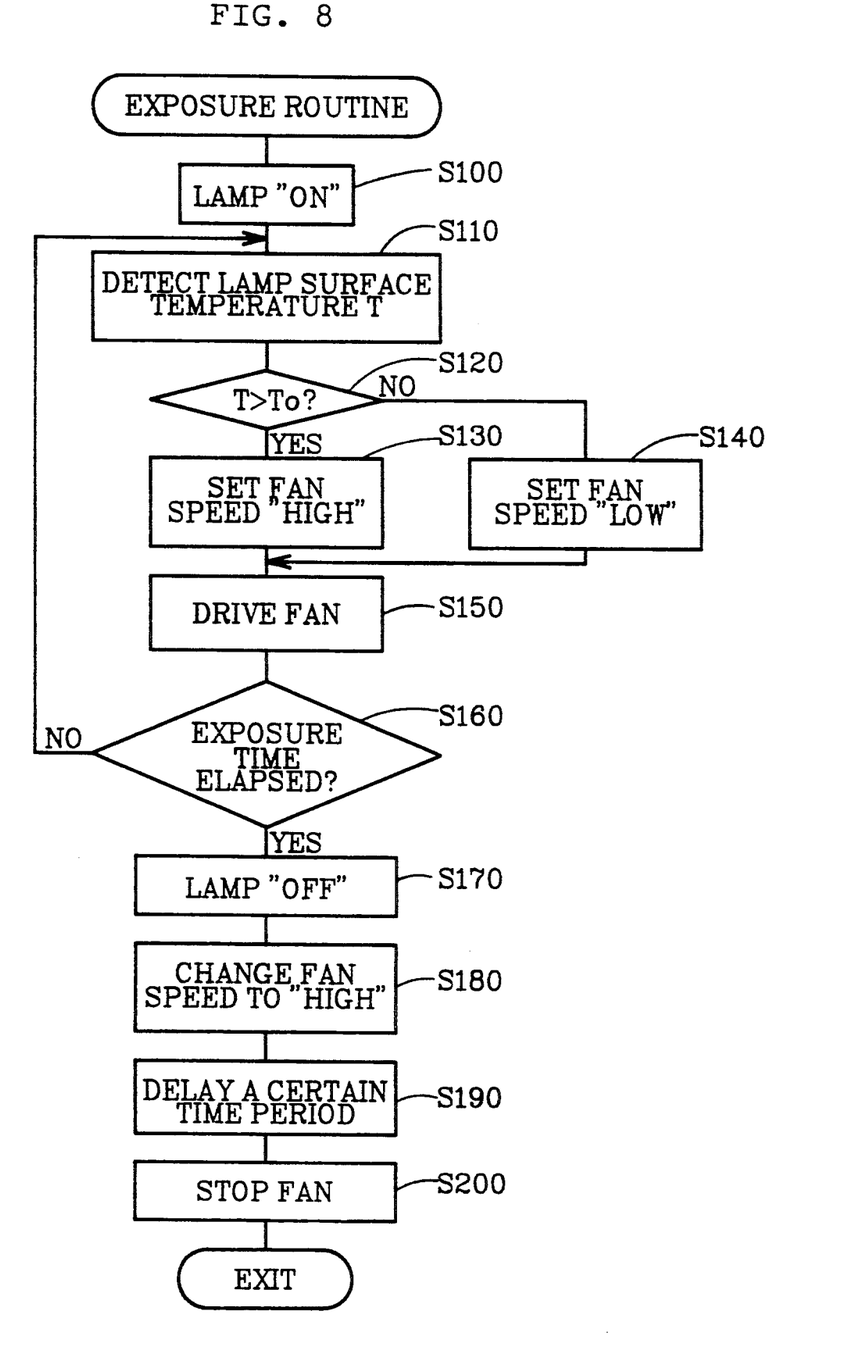
FIG. 8 is a flow chart showing the exposure routine executed by the CPU of the electronic control circuit of FIG. 7.

The exposure routine executed by the electronic control circuit 250 is described based on the flow chart of FIG. 8.

This routine is a sub-routine for controlling the metal halide lamp 205 and the cooling fan 208 and is executed after conditions for exposure such as exposure time are determined and start of exposure is instructed by a main routine.

At step S100, the lamp driver 250d is driven to turn the metal halide lamp 205 on. Then the surface temperature T of the metal halide lamp 205 is calculated based on data detected by the thermocouple 205a at step S110. The program proceeds to step S120 where the surface temperature T is compared with a predetermined temperature T0. When the surface temperature T is determined to be higher than T0, the program proceeds to step S130 at which the cooling fan 208 is set to work at a high speed. On the other hand, when the surface temperature T is determined to be equal to or lower than T0, the program proceeds to step S140 at which the cooling fan 208 is set to work at a low speed. At step S150, the cooling fan 208 is driven at the speed set at step S130 or step S140.

The program then proceeds to step S160 where it is determined if an exposure time predetermined by the main routine (not shown) has elapsed since the metal halide lamp 205 was turned on at step S100. When the answer is 'NO', the program returns to step S110 and steps S110 through S160 are repeated, and when the answer is 'YES', the program proceeds to step S170.

At step S170, the metal halide lamp 205 is turned off and at step S180, the speed of the cooling fan 208 is changed to high. After a predetermined time is delayed at step S190, the cooling fan 208 is stopped at step S200. The program then exits from the exposure routine.

In the exposure routine described above, the metal halide lamp 205 is 'on' for a predetermined exposure time. While the lamp 205 remains 'on', the surface temperature T of the metal halide lamp 205 is detected with the thermocouple 205a. When the surface temperature T exceeds a predetermined temperature T0, the cooling fan 208 is driven at a high speed to lower the surface temperature T of the metal halide lamp 205. On the other hand, when the surface temperature T is not higher than the predetermined temperature T0, the cooling fan 208 is driven at a low speed to maintain the surface temperature T of the metal halide lamp 205 constant. Namely the cooling fan 208 is driven at a speed corresponding to the surface temperature T of the metal halide lamp 205.

The surface temperature T of the metal halide lamp 205 is controlled not to exceed the predetermined value T0 and the color temperature of light emitted from the metal halide lamp 205 thus becomes constant. The copying machine 201 of the third embodiment gives stable images of a well-balanced color, that is, a good combination of cyan, magenta and yellow.

In the exposure routine described above, the cooling fan works at a high speed for a certain time period after the conclusion of exposure so as to sufficiently cool the metal halide lamp 205. When the metal halide lamp 205 is turned on again before it is sufficiently cooled, the luminous intensity of light becomes unstable.

As described above, in the copying machine of the third embodiment, the surface temperature of the exposure lamp consisting of a high pressure discharge tube is maintained constant. The color temperature of light emitted from the exposure lamp is thus maintained stable and accordingly stable images of a desirable color are obtained.

In the above embodiments, the metal halide lamp is used for exposure, but another lamp like a xenon lamp or high pressure sodium lamp may be used instead.

What is claimed is:

1. An image forming apparatus, comprising:
   lighting means for irradiating an original with light during an exposure period;
   processing means for forming images from light reflected by or passed through the original;
   lighting power control means for reducing power to the lighting means such that the lighting means is turned down but is not turned off during a standby period when the lighting means is not irradiating the original for processing by the processing means;
   a high frequency high voltage invertor for applying high voltage to the lighting means;
   current limiting means between the high voltage invertor and the lighting means for selectively limiting a current supplied to the lighting means; and
   control means for controlling the current limiting means to limit the current supplied to the lighting means during the standby period such that the lighting means is turned down but is not turned off.

2. The image forming apparatus of claim 1, in which the lighting means is a discharge lamp.

3. The image forming apparatus of claim 1, in which the lighting means is a metal halide lamp.

4. The image forming apparatus of claim 1, in which the standby period occurs after the machine is turned on, before the exposure period and after each exposure period.

5. The image forming apparatus of claim 1, in which the lighting means has at least three conditions including a first condition when the lighting means turns off so as to not irradiate the original, a second condition when the lighting means turns on to irradiate the original and a third condition when the lighting means turns down but not off.

6. An image forming apparatus, comprising:
   lighting means for irradiating an original with light during an exposure period;
   processing means for forming images from light reflected by or passed through the original;
   plural filters for controlling the tone of light reflected by or passed through the original, where the plural filters are located adjacent to a light path or light reflected by or passed through the original between the original and the processing means;
   driving means for selectively and individually moving each of the plural filters into or out of the light path;
   detecting means for detecting a temperature of the lighting means;
   memory means for storing a plurality of tone correction data corresponding to different temperatures of the lighting means, where each tone correction data corresponding to a filtering configuration indicating which of the plurality of filters are to be moved into the light path; and
   control means for reading from the memory means tone correction data corresponding to the temperature of the lighting means detected by the detecting means and controlling the driving means to move the plural filters into the filtering configuration.

7. The image forming apparatus of claim 6, in which the lighting means is a discharge lamp.

8. The image forming apparatus of claim 6, in which the lighting means is a metal halide lamp.

9. The image forming apparatus of claim 6, further comprising lighting power supply means for supplying power to the lighting means, where the control means further controls the lighting power supply means selectively to turn on and off the lighting means.

10. The image forming apparatus of claim 9, in which the detecting means comprises:
    a thermocouple, which is in contact with the lighting means, that generates an analog signal indicating the temperature on the lighting means;
    analog/digital converting means for converting the analog output of the thermocouple into a digital signal that indicates the temperature of the lighting means and sending the digital signal to the control means.

11. An image forming apparatus, comprising:
    lighting means for irradiating an original with light during an exposure period;
    control means for selectively turning on and off the lighting means;
    processing means for forming images from light reflected by or passed through the original;
    detecting means for detecting a temperature of the lighting means;
    cooling means for cooling the lighting means; and
    lamp temperature control means for controlling the cooling means based on the exposure period and the temperature of the lighting means detected by the detecting means to apply a high level of cooling for the lighting means, when the temperature of the lighting means is above a predetermined threshold, for a predetermined length of time after the control means turns off the lighting means and to apply a low level of cooling to the lighting means when the temperature of the lighting means is below the predetermined threshold, wherein the cooling means is a fan, and the fan rotates at a high speed for the high level of cooling and a low speed for the low level of cooling.

12. The image forming apparatus of claim 11, in which the detecting means comprises:

a thermocouple, which is contact with the lighting means, that generates an analog signal indicating the temperature on the lighting means;

analog/digital converting means for converting the analog output of the thermocouple into a digital signal that indicates the temperature of the lighting means and sending the digital signal to the lamp temperature control means.

* * * * *